United States Patent [19]

Misium et al.

[11] Patent Number: 5,094,936
[45] Date of Patent: Mar. 10, 1992

[54] HIGH PRESSURE PHOTORESIST SILYLATION PROCESS AND APPARATUS

[75] Inventors: George R. Misium, Richardson; Cesar M. Garza, Plano; Cecil J. Davis, Greenville, all of Tex.

[73] Assignee: Texas Instruments Incorporated, Dallas, Tex.

[21] Appl. No.: 544,085

[22] Filed: Jun. 26, 1990

Related U.S. Application Data

[63] Continuation of Ser. No. 245,878, Sep. 16, 1988, abandoned.

[51] Int. Cl.$^5$ .............................................. G03F 7/36
[52] U.S. Cl. ..................................... 430/325; 430/189; 430/313; 430/314; 430/323; 430/324; 430/326; 430/643; 430/190; 430/193; 34/22
[58] Field of Search ............... 430/325, 326, 323, 324, 430/313, 314, 643, 190, 193, 189; 34/22

[56] References Cited

U.S. PATENT DOCUMENTS

| | | | |
|---|---|---|---|
| 4,232,110 | 11/1980 | Taylor | 430/313 |
| 4,396,704 | 8/1983 | Taylor | 430/311 |
| 4,500,628 | 2/1985 | Taylor | 430/311 |
| 4,552,833 | 11/1985 | Ito et al. | 430/325 |
| 4,613,398 | 9/1986 | Chiong et al. | 430/313 |
| 4,768,291 | 9/1988 | Palmer | 34/36 |
| 4,810,601 | 3/1989 | Allen et al. | 430/193 |

FOREIGN PATENT DOCUMENTS 184567  11/1986  European Pat. Off. .

OTHER PUBLICATIONS

Garza, C., "Preliminary Performance Characterization of the DESIRE Process", Texas Inst., Inc., Semiconductor Process & Design Center, pp. 1-8.
Pierce, A., "A Technique for Gas-Phase Analysis-Silylation of Organic Cpds", Pierce Chem. Co., Rockford, Ill., pp. 1-3.
Visser, R. J., et al., "Mechanism and Kinetics of Silylation of Resist Layers from the Gas Phase", S.P.I.E. Conf.-(1987), Phillips Res. Lab., Neth., pp. 1-7.
Taylor, G. N., et al., "Gas-Phase-Functionalized Plasma-Dev. Resists: Initial Concepts and Results for E--Beam Exposure", J. Electrochem. Soc.-S.S.Sc. & T.L., vol. 131, No. 7, 7/1984, pp. 1658-1664.
Wolf, T. M., "The Scope and Mechanism of New Positive Tone Gas-Phase-Functionalized Plasma-Developed Resists", J. Elect. Soc.: SSSc. & Tech., vol. 131, No. 7, 7/1984, pp. 1664-1670.
Spencer et al., "Characterization of Conditions Required to Implement Submicron Processes . . . Advances in Resist Tech. & Processing", V(1988), pp. 295-309.
Brust, T. B., et al., "Mechanistic Study of Selective Gas-Phase Reactive Microlithographic System", SPIE, vol. 771, Adv. in Resist Tech. & Proc. IV, (1987), pp. 102-111.

Primary Examiner—Charles L. Bowers, Jr.
Assistant Examiner—Ashley I. Pezzner
Attorney, Agent, or Firm—Gary C. Honeycutt; Melvin Sharp; N. Rhys Merrett

[57] ABSTRACT

A process for silylation of positive or negative photosensitive resist layer on a semiconductor wafer after the resist layer has been exposed to radiant energy through a mask which includes introducing a silylating agent to the wafer at high pressure over 760 torr and, usually, at temperatures less than 180° C. Increased pressure increases the rate of silylation, allows practical use of lower process temperatures, and, therefore, allows better process control. Also an apparatus is disclosed for applying the high pressure silylation process to a wafer.

5 Claims, 2 Drawing Sheets

HIGH PRESSURE PHOTORESIST SILYLATION PROCESS AND APPARATUS

This application is a continuation of application Ser. No. 245,878 filed Sep. 16, 1988 now abandoned.

BACKGROUND OF THE INVENTION

Integrated circuit dimensions continue to be reduced due to various factors, such as cost per unit function considerations, faster required switching speeds, and desire for lower power consumption. Optical lithographic limitations are currently one of the major factors limiting size reduction in integrated circuit fabrication. Current projections forecast the lower limit of optical photolithography techniques currently under consideration to be less than 0.5 microns. However these techniques require further development to allow submicron fabrication using optical photolithography to be effectively transferred from the design laboratory to production fabrication facilities.

The optical lithographic processes of the prior art have several limitations which have heretofore blocked significant reduction in feature sizing in integrated circuit production. Examples of these limitations are described following. Optical lithographic apparatuses have physically limited depths of field, making it difficult or impossible to expose a thick photosensitive material through its thickness or to expose a layer of photosensitive material accurately which is not topographically planar at its surface. Depth of field is reduced as equipment is configured for smaller and smaller feature size. Wet etching and treating processes usually cause swelling of the remaining photosensitive material and other materials. Such swelling becomes more significant as feature size becomes smaller and prevents achievement of acceptable line to space ratios in some cases. Reflectivity of layer interfaces due to differing refractive indices of the materials causes diffusion and back scattering of the exposing radiation.

Efforts to overcome the limitations of standard optical lithographic equipment and techniques have been numerous and at least somewhat successful and continue to be a major thrust of semiconductor processing research. Multiple layer masks resulting in a thin planar photosensitive surface layer to be optically exposed, various exposure radiation sources and distances, closer tolerance optical equipment, and, in general, optimization of all process parameters relative to each other in the optical lithographic process have all contributed to reducing the minimum feature size possible in integrated circuit production. All of these approaches continue to be studied. However, there continues to be a need for further size reduction and, concurrently, avoidance of the more complicated and costly process steps necessary in some of the techniques to reduce sizing.

A promising development in the continued research to reduce obtainable sizing in optical lithography is advanced by B. Roland and A. Vrancken in "Method for the Preparation of Negative Patterns in a Layer of Photosensitive Resist", European Patent Number 184,567 A1, filed Oct. 24, 1985, "Method for Producing Positive Patterns in a Photoresist Layer," European Patent Number 248,779 A1, published Sept. 12, 1987, and further discussed in "DESIRE: A Novel Dry Developed Resist System", F. Coppmans et al., *Advances in Resist Technology and Processing III, SPIE Proceedings*, Vol. 631 (1986). This development followed closely the more general concepts advanced by G. N. Taylor, et al., in "Gas-Phase-Functionalized Plasma-Developed Resists: Initial Concepts and Results for Electron-Beam Exposure", *Journal of the Electrochemical Society*, Vol. 131, No. 7 (July 1984). These references, to the extent allowable, are incorporated herein by reference. This technique, as has been developed, is described generally in the following paragraphs.

The process generally consists of coating a substrate with a layer of photosensitive resin containing a polymer, preferably a phenolic polymer mixed with or bound to a photosensitive compound such as diazoquinone, exposure of this layer to visible or ultraviolet light through a mask, treating of the exposed layer to a silicon containing compound such as hexamethyldisilane in gas state although a liquid state treatment is possible, and then dry etching of the layer with a plasma such as by an oxygen plasma etch. The silylation is described as being accomplished in a chamber at reduced pressure generally with the substrate and resist layer being heated to a relatively high temperature. The extent of silylation is generally controlled by the length of time exposed to the silylating agent. As pointed out by Roland and Coppmans in the references above, the treatment of the photosensitive layer after exposure results in silylation of the exposed (unmasked) areas of the photosensitive layer with little or no silylation of the unexposed (masked) areas for negative pattern photosensitive resists or, alternately, heavy silylation of the unexposed areas with little or no silylation of the exposed areas for a positive pattern photosensitive resist. Further, discussion will exemplify the use of the negative pattern photosensitive resist, however, it will be understood that the inventive process and apparatus apply equally to both. Silylation, as defined in Silylation of Organic Compounds, by A. Pierce, Pierce Chemical Company, pages 1-3, and further explored in "Mechanism and Kinetics of Silylation of Resist Layers from the Gas Phase", R. Visser, et al., *SPIE*, Vol. 87, is the introduction of the silyl group (generally —Si(CH3)3) into a molecule, generally by replacement of a hydrogen. In the case of silylation of a resist layer, the silylating agent diffuses into and reacts with the exposed resin of the resist layer according to the generalized formula:

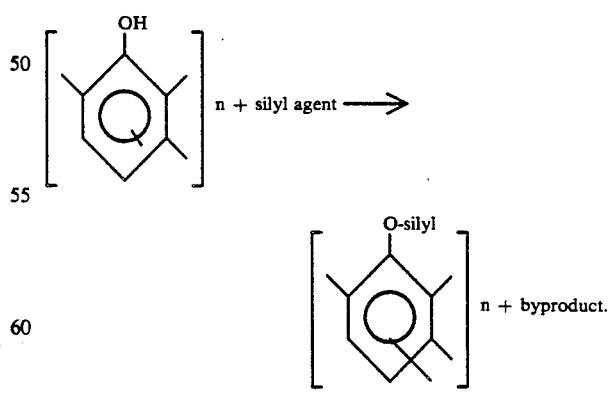

The kinetics of the reaction, particularly the rate of diffusion, cause the silylation to be highly selective to the exposed areas of the photoresist and to be restricted to only the near surface of the resist layer, e.g., the top 1000 to 10,000 Angstroms. Deeper exposures of the photoresist layer may be limited by techniques such as dying of the photoresist material. An anisotropic plasma etch, particularly an oxygen plasma etch, causes the incorporated silicon to form silicon dioxide which acts as an in-situ mask for the etch, oxygen plasma etching being highly selective to the silicon dioxide compared to the remainder of the resist.

This process presents several advantages for optical lithography. Since the silylation is restricted to only the topmost portion of the resist layer, exposure depth may be restricted to only that depth or, in any case, deeper exposure which may not be accurately focused becomes less important. This greatly reduces depth of field problems and the problems associated with diffusion of the exposure radiation. A dry etching process may be used to develop the resist layer because of the high selectivity of a plasma etch to the silylated regions. Therefore the problems caused by wet etching techniques are eliminated. Because the silylation is highly selective to the exposed versus unexposed portions of the resist layer, acceptably precise mask layers may be produced from the resist layer.

There are, however, problems associated with the above described process. Exposure of the resist layer to the silylating agent is described in the references as being accomplished at high temperatures and for relatively long time periods, especially if the temperature is not high. Control of the extent of silylation has been difficult. Silylation has been described in the literature as being accomplished at low pressures, requiring vacuum or low pressure processing receptacles.

BRIEF DESCRIPTION OF THE INVENTION

The invention contemplates silylation of a photoresist layer after exposure of the layer through a mask by radiation by introducing a silylating agent to the layer under pressure of at least one atmosphere or higher and contemplates reducing the temperature of the resist layer (and the substrate thereunder) to less than 180 degrees C.

Further, the invention contemplates an apparatus for silylating an exposed resist layer on a semiconductor substrate comprising a chamber, a means to heat the substrate and resist layer, a port to introduce a silylating agent and an inert pressurizing agent, if necessary, under pressure to the chamber, and at least one pressure valve to control the pressure in the chamber and maintain a pressure of one atmosphere or higher in the chamber.

By the invention, it has been discovered that for a given temperature, the time to reach a desired level of silylation of the exposed photoresist is reduced.

By the invention, it has been discovered that the process may be undertaken at lower temperatures by increasing the pressure under which the silylating agent is introduced to the resist.

By the invention, it has been discovered that the processing parameters of time and temperature may be effectively more controllable and therefore the extent of silylation more controllable by utilizing a high pressure silylating apparatus.

These and other advantages of the inventive process and apparatus will become evident from the following drawing figures and detailed description of the invention.

BRIEF DESCRIPTION OF THE DRAWING FIGURES

DETAILED DESCRIPTION OF THE INVENTION

The optical lithography process of the prior art will be described with respect to FIGS. 1A-1C. A semiconductor wafer substrate 1 with photosensitive resist layer 2 is exposed through mask 3 by radiation 4 generally radiated in an orthogonal direction relative to the surface of resist layer 2. The substrate 1 may be a semiconductor wafer, e.g. single crystal silicon, during any stage of processing requiring a lithography step. The substrate 1 therefore may contain implanted active and passive devices (not shown), devices formed on the semiconductor, one or more conductive layers and one or more insulating layers. The photosensitive resist layer may be any mixture or compound which is photosensitive and is capable of being silylated. Preferably the resist layer is a phenolic polymer combined with a photosensitive compound, such as diazoquinone. The photosensitive resist layer is applied and cured in a manner known in the art. Mask 3 as is well known in the art is an image forming mask, transparent to exposing radiation in selected areas and blocking the exposing radiation in the remaining areas. Radiation 4 may be visible or ultraviolet radiation or may be coherent light, X-rays, or electron beams, for example. Of course, the resist layer must be sensitive to the radiation utilized.

Figure 1A:
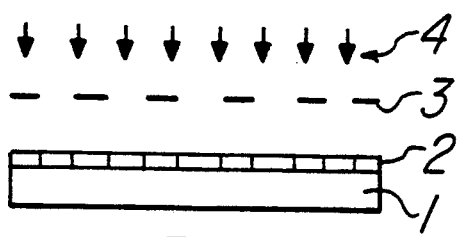
FIGS. 1A-1C are schematic drawings of the optical lithographic process according to the prior art.
Figure 1B:
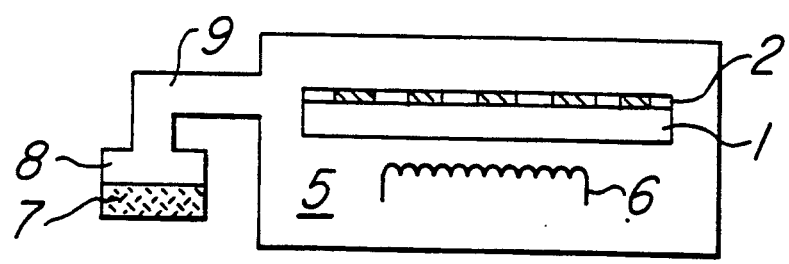

Referring to FIG. 1B, the substrate and exposed resist layer is introduced to a silylating chamber 5, which is commonly a vacuum or reduced pressure chamber. The substrate and resist layer is heated by heating element 6 to a temperature of 180 degrees C. or higher. A silylating agent 7 is allowed to vaporize in a generating chamber 8 which is in communication with silylating chamber 5 via passage 9, for example. The gas state silylating agent therefore contacts the exposed resist layer 2. The silylating agent diffuses into the exposed portions of the mask layer and reacts with the polymer of this layer to replace a hydrogen atom with a silyl group. It is pointed out that only the uppermost portion of the resist layer is silylated and that the unexposed portions of the resist layer are not silylated. Examples of silicon compounds which can be used as the silylating agent include but are not limited to tetrachlorosilane, alkylhalosilanes, and arylhalosilanes. Specific examples are trimethylchlorosilane, dimethyldichlorosilane, methyltrichlorosilane, trimethylbromosilane, trimethyliodosilane, and triphenylchlorosilane. Also, disilazanes may be utilized, such as, hexamethyldisilazane, heptamethyldisilazane, and hexaphenyldisilazane. The reaction of the silylating agent with the exposed resist layer must be closely controlled as to time and temperature of the reaction so that enough silicon is diffused and reacted with the resist polymer to prevent etching of the exposed resist in the subsequent plasma etch step while insuring that silicon does not diffuse sufficiently into the unexposed regions to prevent etching there. The temperature limits of this phase of the process are limited to below the temperature which will melt or seriously damage the resist material (or the semiconductor devices) and above the temperature required to vaporize the silylating agent. However, at temperatures of above 180 degrees C. it has been observed by the inventors of the instant invention that the silylating reaction occurs at an accelerated rate down to a few seconds which rate becomes increasingly difficult to control. Excess silicon, particularly silicon diffused into the unexposed resist portions but not chemically bonded to the polymer, may then be removed by evaporation, usually in a vacuum.

Figure 1C:
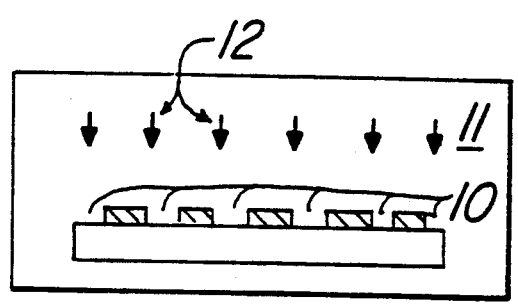

Referring now to FIG. 1C, the substrate 1 with silylated resist layer 2 is exposed to a reactive ion etch, preferably a plasma oxygen 12 etch. This step of the process is also conducted in a chamber 11. The particulars of such a plasma oxygen etch are well known in the art and will not be detailed here. It is believed that in an oxygen plasma etch, oxygen combines with the silicon incorporated in the mask to form silicon dioxide which is highly resistant to the plasma etch. At any rate, the plasma etch effectively removes the portions 10 which have not been silylated. This dry etch process can be effected such that the etch is highly anisotropic and highly selective therefore allowing vertical lateral walls, high resolution, and minimum line and space width. If the exposed regions of the mask are not adequately silylated, the width of the remaining lines will be less than the width of the lines of the original mask 3. If the unexposed regions of the mask incorporate too much silicon by diffusion, the resulting lines of left in the resist layer will be wider than the lines of the original mask 3. Therefore to produce the desired pattern in the resist layer, it is necessary to accurately and reproducibly control the silylation step of the process.

Figure 2:
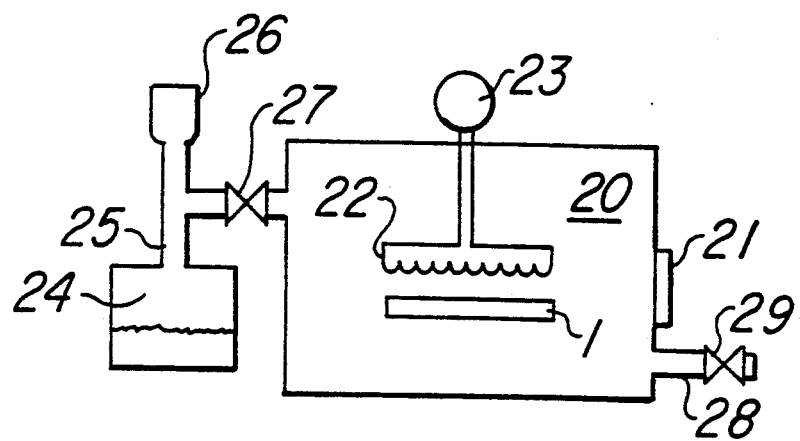
FIG. 2 is a schematic diagram of an embodiment of the silylating apparatus of the invention.

An apparatus for silylating the resist layer of a semiconductor substrate according to the instant invention will be explained with reference to FIG. 2. A silylation chamber 20 includes a sealable port 21 through which a semiconductor wafer 1 with resist layer may be inserted into the chamber. A heating element 22 may be included in the chamber. Heating element 22 commonly includes a holder, not detailed, which holds the wafer 1 in communication with the heating element. Alternately, the heating element may be situated in the chamber but not in contact with the wafer to heat the contents of the chamber, or, the heating element may be outside the chamber to heat the chamber and its contents. Heating element 22 is connected to a temperature control 23 which controls the temperature of the wafer. Silylating agent generator 24 is in fluid communication with chamber 20 such as by passage 25. Generator 24 produces a silylating agent in gas phase. Pressurizing element 26 is also in fluid communication with silylation chamber 20 to provide a controllable pressure of at least one atmosphere (760 torr) in the chamber. Pressurizing element 26 may be, e.g., a source of pressurized inert gas, such as N2. A pressure controller such as control valve 27 controls the pressure in the chamber to a substantially constant preselected pressure at or above one atmosphere and in this case controls the introduction of the silylating agent to the chamber, also. Pressurizing element 26 may be, alternately, other means, such as a means to reduce the volume of the chamber. The pressure controller may include a pressure measuring device. An evacuation passage 28 and evacuation valve 29 is included to clear the silylation chamber.

In operation, a wafer having a radiation exposed resist layer such as that obtained in the prior art as shown in FIG. 1A is introduced into the chamber 20. Note that it is also contemplated that the wafer can be exposed while in the chamber 20. Heating element 22 is turned on to heat the wafer to a preselected temperature such as 160 degrees C. A silylating agent is introduced to the chamber by opening control valve 27. Also, pressurizing element 26 is operated to provide a preselected pressure in the chamber of at least 760 torr, for example, 1000 torr. The preselected pressure is maintained by operation of control valve 27 in cooperation with evacuation valve 29. After a time period which can be easily determined by experimentation, for example, and which is not critical over a range for the operation according to the invention, the chamber is purged of the silylating agent via evacuation passage 28 by operation of evacuation valve 29.

Figure 3:
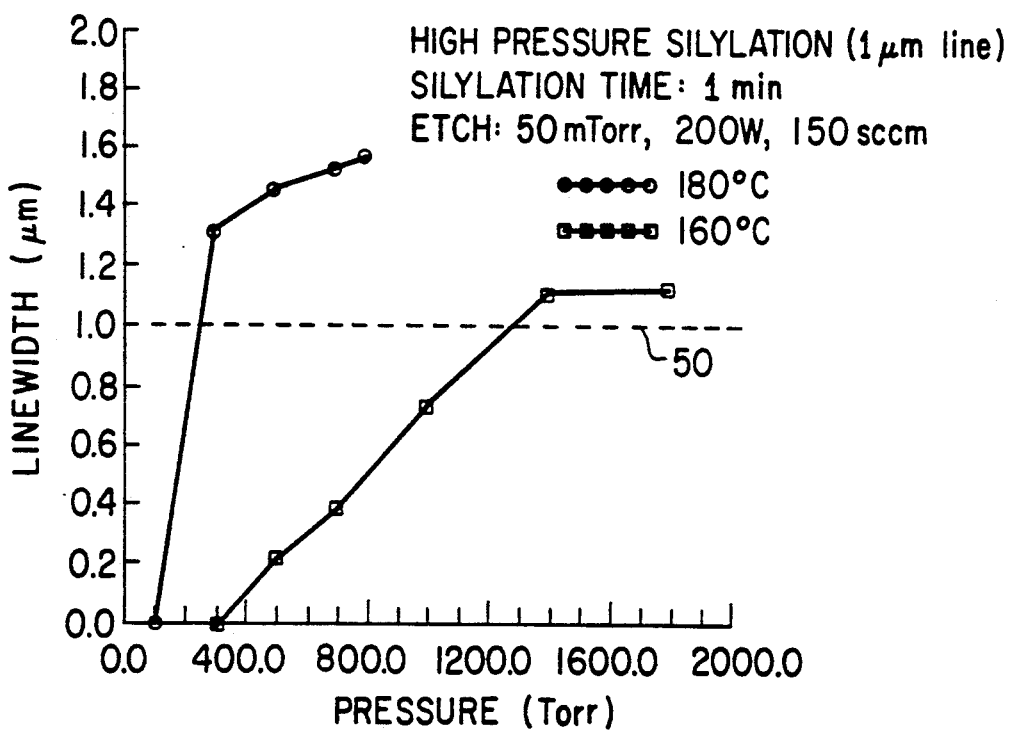
FIG. 3 is a graph of experimental results of the process of the invention plotting linewidth vs. pressure.
Figure 4:
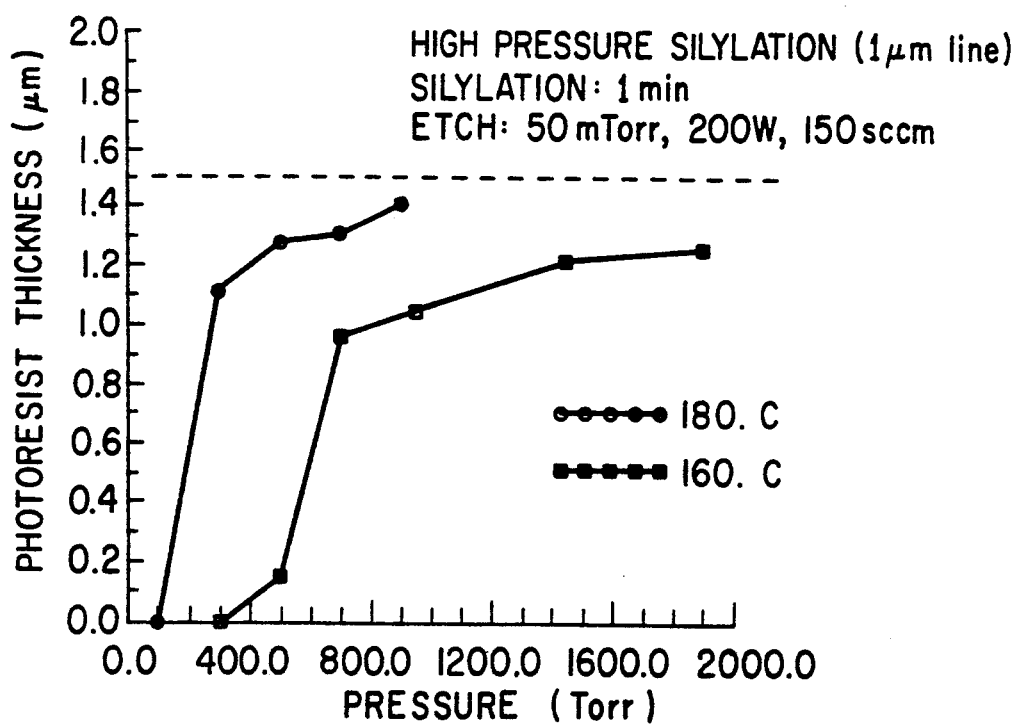
FIG. 4 is a graph of the experimental results of the process of the invention plotting resist thickness of silylation vs. pressure.

Experimental results have quantitatively shown that silylation of a resist layer at pressures of 760 torr and above produce superior and unexpected results over silylation conducted at lesser pressures. Referring to FIGS. 3 and 4, both graphs were produced using wafers having the photosensitive resist layer exposed by ultraviolet radiation through a mask having 1 micron linewidths. Using hexamethyldisilazane (HMDS) as the silylating agent pressurized by N2 for a period of one minute at temperatures of 160 degrees and 180 degrees C., wafers were silylated at various pressures from 100 to 1800 torr. The wafers were then plasma oxygen etched at 50 mTorr and 200 W with a gas flow of 150 sccm. The width and thickness of the resulting lines in the resist layer were then measured. Referring to FIG. 3, it can be seen that for a silylation temperature of 180 degrees C., the width of the line rises from zero to about 1.3 microns while the pressure changes only from 100 to 140 torr. In FIG. 3, dotted line 50 represents the desired linewidth, 1 micron, given the original mask linewidth of 1 micron. It is evident that a silylation temperature of 180° C. is less acceptable for controlling the silylation rate due to the approximated slope of the curve. A very small change in pressure causes a large change in the degree of silylation as represented by the linewidth. A change ($\Delta P$) of 200 torr increases the silylation rate from unacceptably low (0.0 micron linewidth or complete under silylation) to unacceptably high (1.2 micron linewidth or 20% over silylation). From a time perspective it is clear that for any pressure over 300 torr, correct silylation time must be considerably less than 1 minute. Such a short time period also would be hard to control. A small change in silylation time would lead to a relatively large change in resulting linewidth (extent of silylation). A 160° C. silylation temperature, on the other hand, results in a considerably more easily controllable process as indicated by the slope of this approximated curve in FIG. 3. For example, in the area of the curve below the desired 1 micron linewidth, a change ($\Delta P$) of 40 torr results in only about 0.035 microns change in the linewidth. From a time perspective, however, it is apparent that for pressures of less than 760 torr, which are almost exclusively used in the prior art, a silylation time of considerably longer than one minute would be required for acceptable linewidth (degree of silylation) if a silylation temperature of 160° C. is used. The inventors have found, in fact, that to use a 160° C. silylation temperature or less at substantially less than 760 torr silylation pressure, an considerably longer time would be required to achieve the desired linewidth (degree of silylation).

FIG. 4 depicts the result of measurements of the photosensitive resist layer thickness in exposed regions of the resist after plasma oxygen etch using the same etch process parameters and a one minute silylation time using wafer having the same photosensitive resist material and using the same silylating agent (HMDS) as used in FIG. 3. The resist thickness before processing was 1.5 microns for all wafers. Therefore, it is desired in the best case that as close as practical to 1.5 microns of resist material remains after etching. The desired thickness is graphically represented by dotted line 51. Again, from FIG. 4, it is apparent that increasing silylation pressure increases the silylation rate in the exposed resist material since in each case for a one minute silylation time, a greater thickness of the resist layer remains as the silylation pressure incrementally is increased. Also indicated by FIG. 4, is confirmation that decreasing the silylation temperature results in a process which is effectively controllable over a broader range of silylation pressures.

The inventors have concluded and verified that conventional low pressure silylation is not as controllable to obtain desired etch patterns as high pressure silylation (above 760 torr) and, further, that higher pressure silylation allows the more effective utilization in terms of time, controllability, and satisfactory etched resist patterns of silylation temperatures less than 180° C. (preferably about 160° C. or less). Although the mechanisms of high pressure silylation are not completely understood it has been clear to the inventors from substantial testing and experimentation that use of higher pressures and lower temperatures in the process than practiced in the prior art results in a substantially more controllable, faster, and more usable process. Concentration levels of the silylating agent has been experimentally eliminated as a substantial source of the observed silylation rate change as pressure is increased.

Various modifications and embodiments of the described invention and detailed embodiments will become obvious to the skilled artisan upon reference to the description and drawing figures herein. The claims following are contemplated to include within their breadth any such modification or embodiment.

We claim:

1. A process for patterning a photoresist layer on a semiconductor wafer substrate, comprising:
    (a) selectively exposing portions of said photoresist layer to radiant energy;
    (b) then exposing said radiation exposed photoresist layer to a silicon-containing material in gas form, at a temperature above ambient but no greater than about 160° C., and at a pressure between 800 and 2000 Torr, for a time sufficient to cause silylation of only the surface portion of the radiation exposed photoresist; and
    (c) then treating the radiation exposed and silylated photoresist layer with a plasma etchant, to develop a pattern by removing those portions of said photoresist layer which have not been silylated.

2. A process as in claim 1 wherein said photoresist layer comprises a phenolic polymer and a photosensitive resin.

3. A process as in claim 1 wherein said silicon-containing material comprises hexamethyldisiazane.

4. A process as in claim 1 wherein the pressure is maintained by adding a pressurized intert gas with the silicon-containing material.

5. A process as in claim 1 wherein said plasma etchant comprises oxygen.

* * * * *